![US007494878B2]

(12) United States Patent
Lee et al.

(10) Patent No.: US 7,494,878 B2
(45) Date of Patent: Feb. 24, 2009

(54) METAL-OXIDE-SEMICONDUCTOR TRANSISTOR AND METHOD OF FORMING THE SAME

(75) Inventors: Kun-Hsien Lee, Tai-Nan (TW);
Cheng-Tung Huang, Kao-Hsiung (TW);
Wen-Han Hung, Kao-Hsiung (TW);
Shyh-Fann Ting, Tai-Nan (TW);
Li-Shian Jeng, Tai-Tung Hsien (TW);
Tzyy-Ming Cheng, Hsin-Chu (TW);
Neng-Kuo Chen, Hsin-Chu (TW);
Shao-Ta Hsu, Tai-Nan (TW);
Teng-Chun Tsai, Hsin-Chu (TW);
Chien-Chung Huang, Tai-Chung Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 2 days.

(21) Appl. No.: 11/552,532

(22) Filed: Oct. 25, 2006

(65) Prior Publication Data

US 2008/0099801 A1 May 1, 2008

(51) Int. Cl.
*H01L 21/8234* (2006.01)

(52) U.S. Cl. ............ 438/275; 438/258; 438/682; 257/E21.421; 257/E21.622

(58) Field of Classification Search ........... 438/224, 438/651; 257/E21.051, E21.177, E21.37, 257/E21.4, E21.421, E21.615, E21.622
See application file for complete search history.

(56) References Cited

U.S. PATENT DOCUMENTS

| 2005/0059228 | A1  | 3/2005  | Bu et al.        |         |
|--------------|-----|---------|------------------|---------|
| 2005/0218455 | A1* | 10/2005 | Maeda et al.     | 257/368 |
| 2007/0202653 | A1* | 8/2007  | Hoentschel et al.| 438/301 |
| 2007/0235823 | A1* | 10/2007 | Hsu et al.       | 257/411 |
| 2008/0003734 | A1* | 1/2008  | Chuang et al.    | 438/199 |

* cited by examiner

*Primary Examiner*—Walter L Lindsay, Jr.
*Assistant Examiner*—Cheung Lee
(74) *Attorney, Agent, or Firm*—Winston Hsu

(57) ABSTRACT

A method of manufacturing a MOS transistor device. First, a semiconductor substrate having a gate structure is prepared. The gate structure has two sidewalls and a liner on the sidewalls. Subsequently, a stressed cap layer is formed on the semiconductor substrate, and covers the gate structure and the liner. Next, an activating process is performed. Furthermore, the stressed cap layer is etched to be a salicide block. Afterward, a salicide process is performed to form a silicide layer on the regions that are not covered by the stressed cap layer.

14 Claims, 17 Drawing Sheets

METAL-OXIDE-SEMICONDUCTOR TRANSISTOR AND METHOD OF FORMING THE SAME

BACKGROUND OF THE INVENTION

1. Field of the Invention

The present invention generally relates to the field of metal-oxide-semiconductor (MOS) transistors, and more particularly, to a method for forming MOS transistors having strained silicon. From one aspect of the present invention, a stressed cap layer is formed on a MOS transistor after a spacer on the MOS transistor is removed. As a result, the stressed cap layer can make a structural strain, increase a drive current of the MOS transistor, and develop the performance of the MOS transistor.

2. Description of the Prior Art

As semiconductor technology advances and development of integrated circuits revolutionizes, the computing power and storage capacity for computers also increase exponentially, which further increases the expansion of related industries. As predicted by Moore Law, the number of transistors utilized in integrated circuits has been doubled every 18 months and semiconductor processes also have advanced from 0.18 micron in 1999, 0.13 micron in 2001, 90 nanometer in 2003, to 65 nanometer in 2005. As the semiconductor processes advance, how to increase the driving current for MOS transistors for fabrication processes under 65 nanometers has become a great challenge.

A variety of methods have been provided for increasing the driving current of MOS transistors. For example, US Patent Application with Publication Number 2005/0059228 teaches a method for increasing the driving current of MOS transistors. According to the U.S. patent application, an annealing process for a nitride-oxide composite cap is performed to change a dopant distribution in the substrate, so the electron mobility in the channel is increased. As a result of this increased mobility, the device current drive is improved. Please refer to FIGS. 1-6 for the above-mentioned method. FIGS. 1-6 are schematic cross-sectional diagrams illustrating a prior art method of increasing the driving current of MOS transistor. As shown in FIG. 1, a device 300 is provided. The active regions 302 and 303 are formed in a substrate 309 by implanting an n-type dopant 310 with a specific energy and dose into the substrate 309 to achieve a suitable depth and concentration for the active regions 302 and 303. In addition, a p-type dopant implant is also performed. Such an implant places the boron dopant 315 deeper than the n-type dopant 310. Thus, a p-type channel region 301 is defined between the active regions 302 and 303. The device 300 includes a channel region 301, active regions 302 and 303, a gate oxide layer 304, a poly oxide 305, a polysilicon gate 306, and an optional thin offset spacer 311, which is typically comprised of silicon nitride.

As shown in FIG. 2, sidewall spacers 412, 413, and 414 are formed and located, adjacent to the gate oxide layer 304 and the polysilicon gate 306. Subsequently, utilizing the polysilicon gate 306, the sidewall spacers 412, 413, and 414 as a mask, a ion implantation is performed with a n-type dopant such as As or P, which forms a source region 407 and a drain region 408.

As shown in FIG. 3, the composite cap 516 is typically deposited by a low temperature chemical vapor deposition process. The composite cap 516 comprises a relatively thin liner (not shown), typically comprised of oxide or oxynitride, and a nitride layer formed on the thin liner. An example of a thickness for the thin liner is about 50 to 100 Angstroms and an example of a thickness for the nitride layer is about 300 or more Angstroms. It is noted that the composite cap 516 is selectively removed so as to not cover PMOS devices through an additional patterning step followed by combinations of wet or plasma etching.

As shown in FIG. 4, the semiconductor device 300 undergoes a rapid thermal annealing process. The purpose of the annealing process is to activate the dopants implanted for source/drain extension and source/drain, and to cure crystal damage induced by the previous active implant process. The composite cap 516 has an abundance of hydrogen in the nitride film. During the rapid thermal anneal, hydrogen is released from the nitride film and it is introduced into the surrounding structures, such as the sidewall oxide and the thin liner under the nitride. Because of the increased hydrogen concentration in the oxide from the hydrogen 617 in the nitride film, p-type dopant (e.g., boron) segregation from the channel region 301 to the spacer oxide 412 or the composite cap 516 is enhanced. As a result, there is a net boron dopant loss in the channel, which reduces the dopant pile up at the Si/SiO2 interface. Therefore, the hydrogen 617 modifies the dopant profile for the channel region and creates a retrograde profile, and improves the electron mobility for the channel region 301.

As shown in FIG. 5, the composite cap 516 is removed by etching. As shown in FIG. 6, a salicide process is performed. The formation of salicide begins after the composite cap 516 is removed. Silicide regions 818 are formed on the active regions 302 and 303, and on the polysilicon gate 306. A salicide process in which a refractory metal, such as cobalt or nickel, is deposited on the regions 818, is performed and the refractory metal reacts with the underlying polysilicon or silicon layer by an allow step forming silicide. Unreacted refractory metal is then removed.

The prior art method decreases the dopant pile to improve the electron mobility for the channel region 301, but the method is limited to the structure of the offset spacer 311, the sidewall spacer 412, the sidewall spacer 413, the sidewall spacer 414, and the composite cap 516. Thus, it can only change the dopant concentration at the interface between the channel region 301 and the polysilicon gate 306, and the development is quite restricted.

On the other hand, while the NMOS is improved, the PMOS is degraded. This is due to the dose loss at a p-type lightly-doped-drain (PLDD). Since at PLDD implant, the dopant is typically placed much closer to the surface than the "pocket" for the NMOS, the dopant loss is more substantial. The dopant loss causes an increase in the parasitic resistance in source/drain extension and source/drain region. As a result, the composite cap 516 in the prior art method cannot be applied to the PMOS, and it is still a challenge in increasing the driving current of MOS transistors.

SUMMARY OF THE INVENTION

It is the primary object of the present invention to provide a method for forming a MOS transistor having strained silicon. Accordingly, a stressed cap layer is formed on a MOS transistor after a spacer on the MOS transistor is removed. The stressed cap layer can develop the performance of the MOS transistor.

According to the claimed invention, a method of manufacturing a MOS transistor is disclosed. A semiconductor substrate having a gate structure is prepared. Subsequently, a shallow-junction source extension and a shallow-junction drain extension are formed in the semiconductor substrate on two opposite sides of the gate structure. A liner and a spacer are thereafter formed, the liner adjacent to two opposite sidewalls of the gate structure, the spacer positioned on the liner. Next, a first ion implanting process is performed on the semiconductor substrate using the gate structure and the spacer as an implantation mask, and thereby a source region and a drain region are formed in the semiconductor substrate on two opposite sides of the gate structure. The spacer is thereafter removed. Afterward, a stressed cap layer is formed on the semiconductor substrate, and the stressed cap layer covers the gate structure, the liner, the source region and the drain region. Next, an activating process is performed on the source region, the drain region and the stressed cap layer. Furthermore, the stressed cap layer is etched to expose the gate structure, the source region and the drain region. Accordingly, a salicide process is performed to form a silicide layer on the gate structure, the source region and the drain region.

From one aspect of the present invention, a method of manufacturing MOS transistors is disclosed. A semiconductor substrate having is prepared, and a first active region, a second active region and a third active region are defined in the semiconductor substrate. Each of the active regions comprises at least a gate structure, a source region and a drain region. Two sidewalls on each of the gate structures comprise a liner. The source region and the drain region are positioned in the semiconductor substrate on the opposite sides of the gate structure. Subsequently, a stressed cap layer is formed on the semiconductor substrate, and the stressed cap layer covers the gate structures, the liners, the source regions and the drain regions in the first, the second and the third active regions. Thereafter, a first etching process is performed on the stressed cap layer to expose the gate structure, the source region and the drain region in the second active region. Next, an activating process is performed on the source regions, the drain regions and the stressed cap layer. Furthermore, a second etching process is performed on the stressed cap layer to expose the gate structure, the source region and the drain region in the first active region. Accordingly, a salicide process is performed to form a silicide layer on the gate structures, the source regions and the drain regions that are not covered by the stressed cap layer in the first and the second active regions.

Because a stressed cap layer is formed on a MOS transistor after a spacer on the MOS transistor is removed, the stressed cap layer can make a structural strain, increase a drive current of the MOS transistor, and develop the performance of the MOS transistor.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
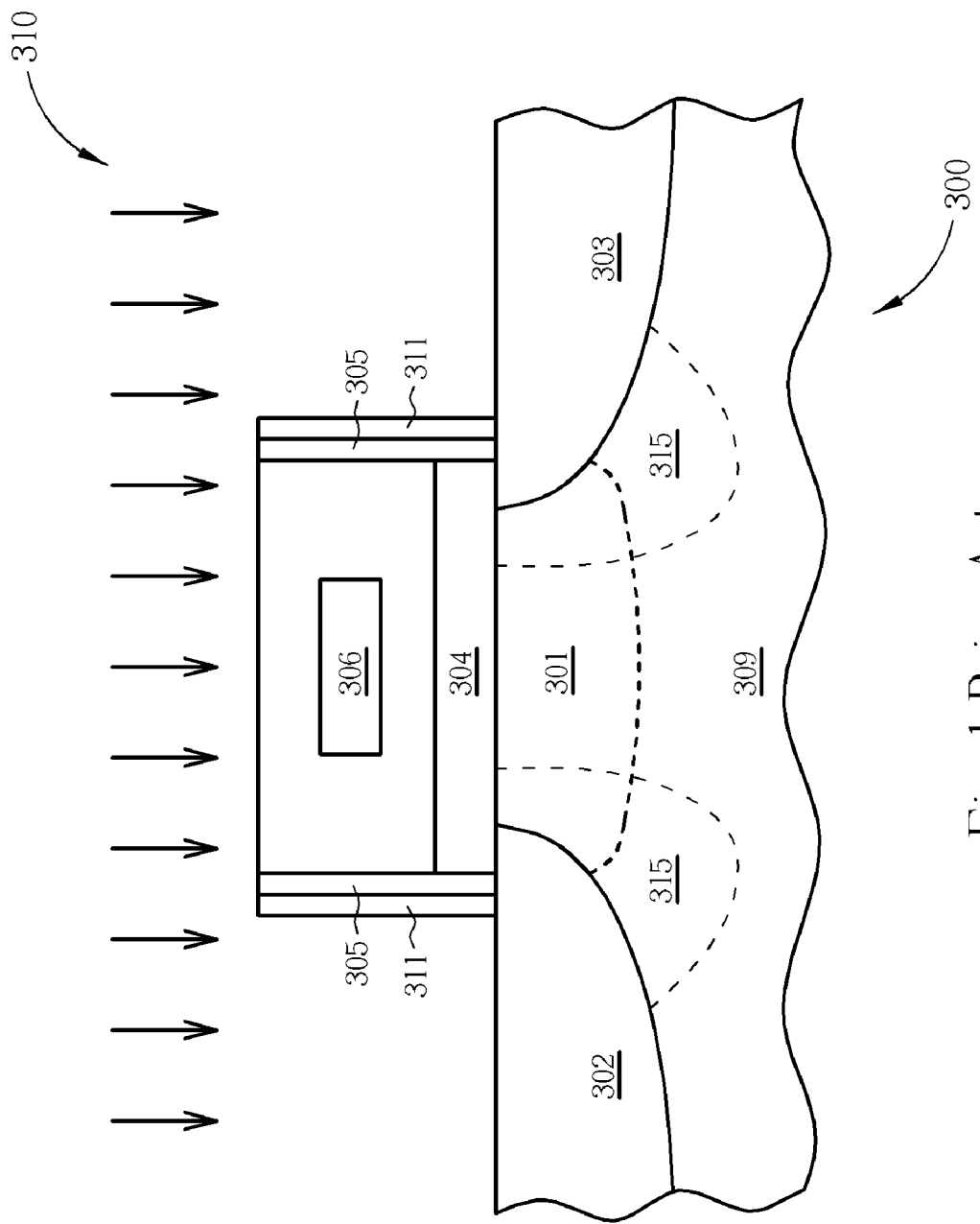
FIGS. 1-6 are schematic cross-sectional diagrams illustrating a prior art method of increasing the driving current of MOS transistor.
Figure 2:
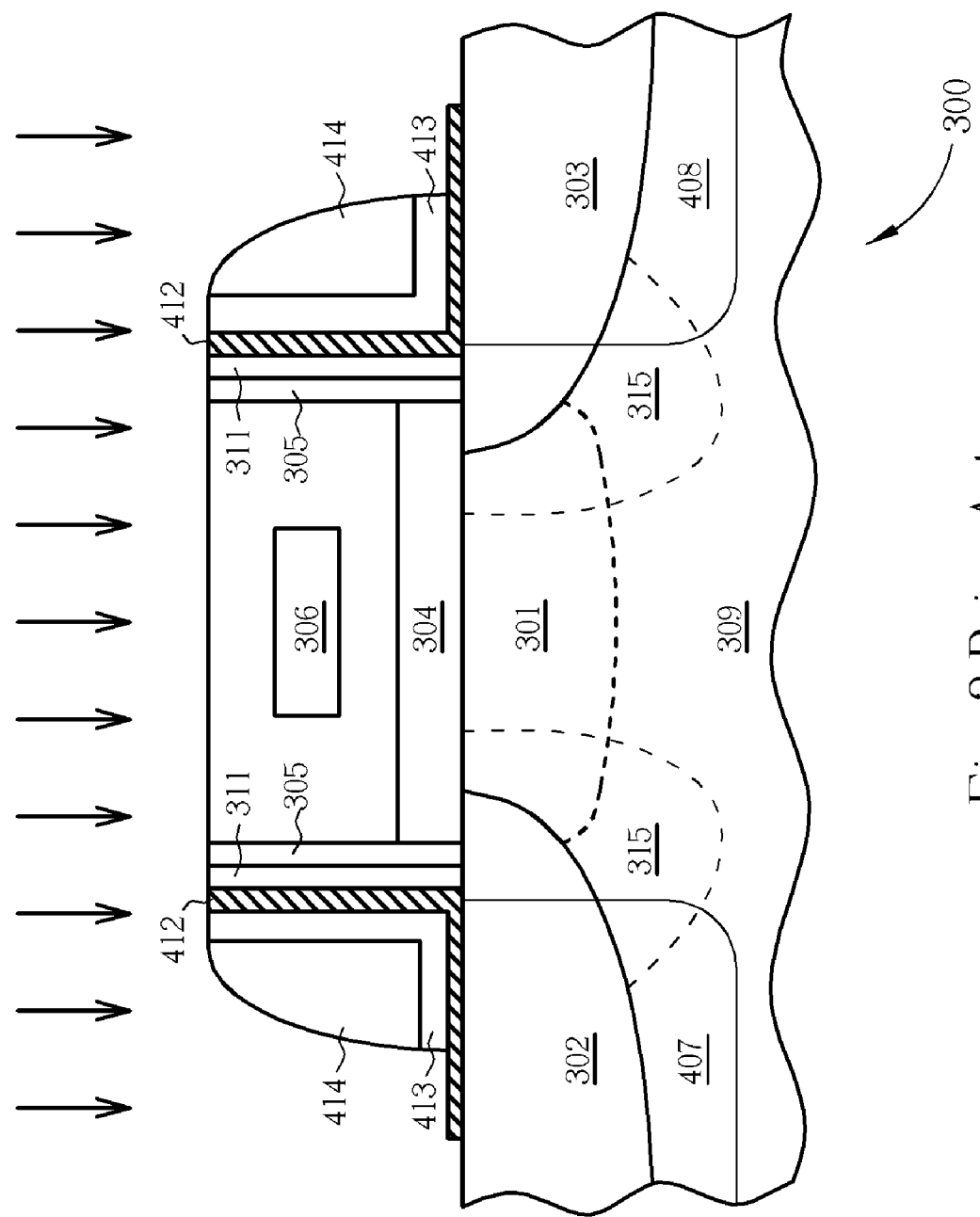
Figure 3:
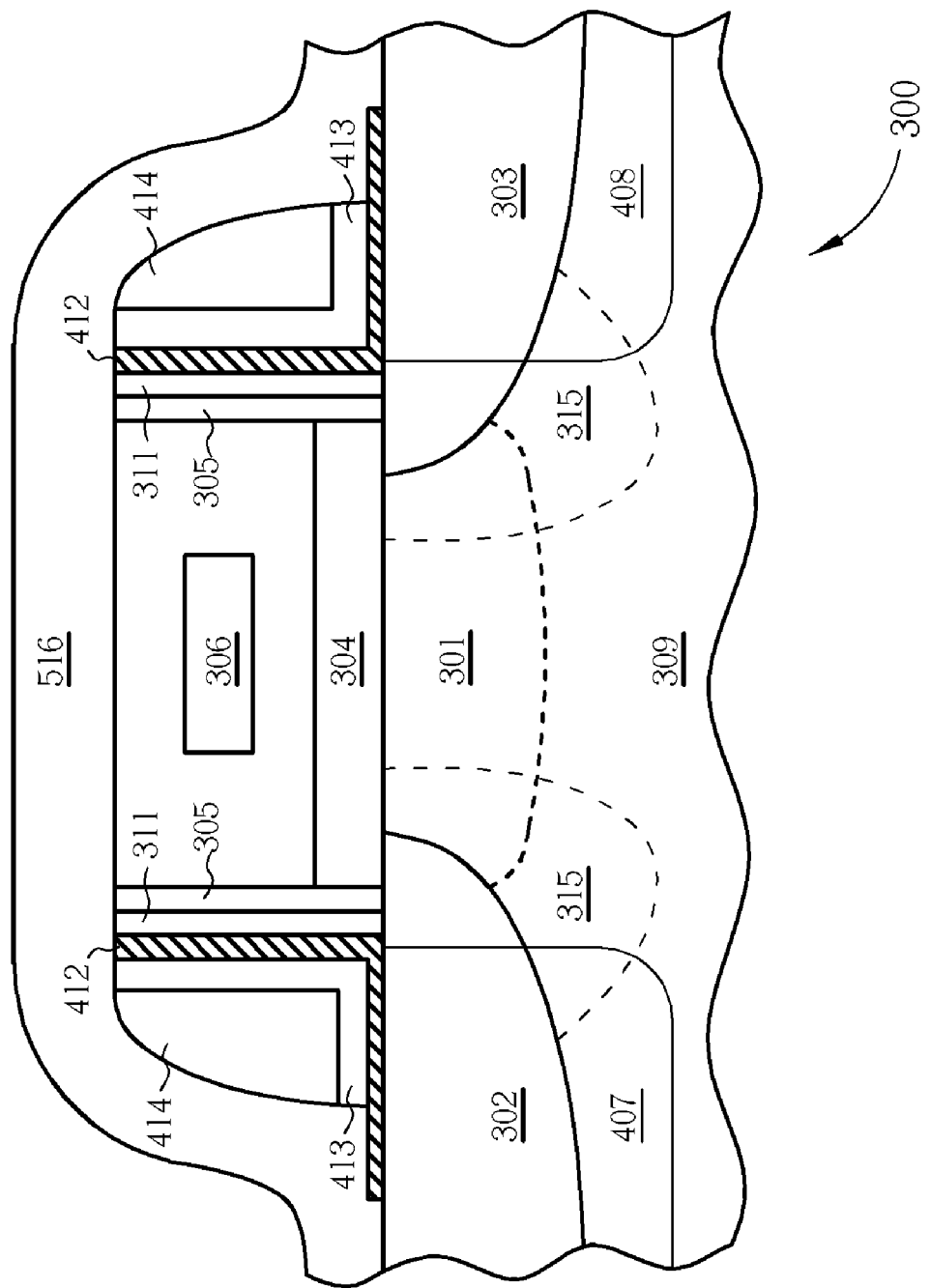
Figure 4:
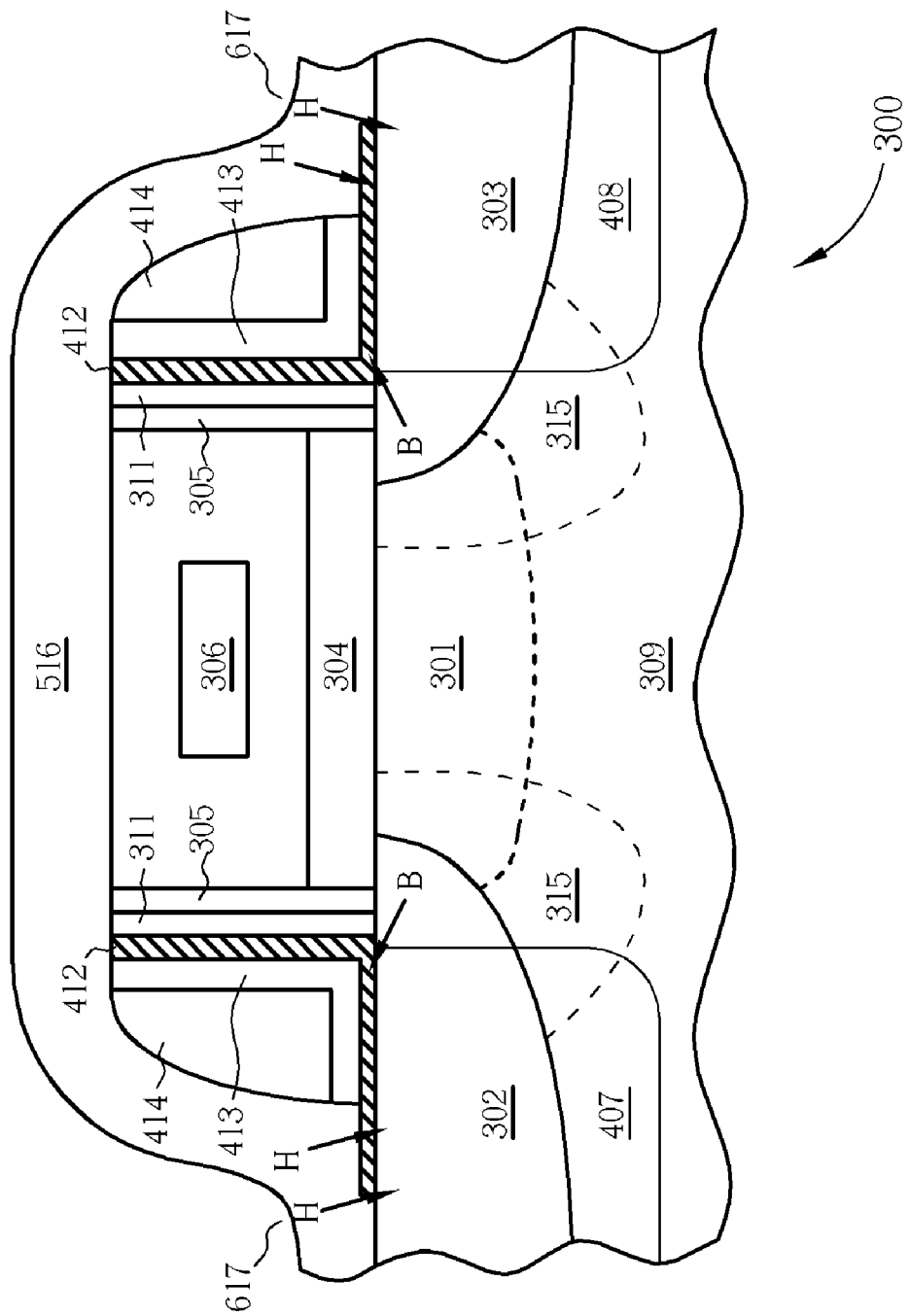
Figure 5:
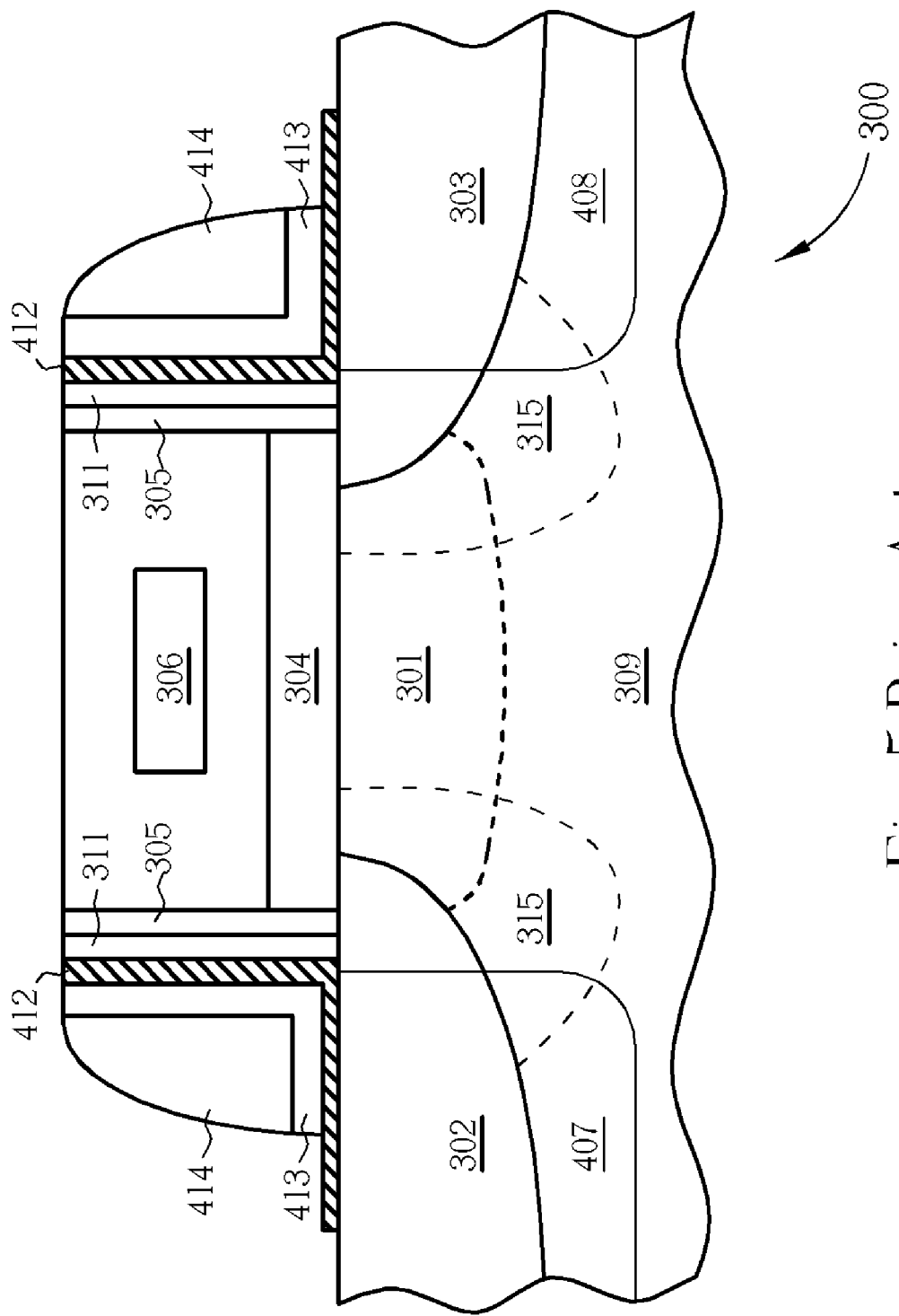
Figure 6:
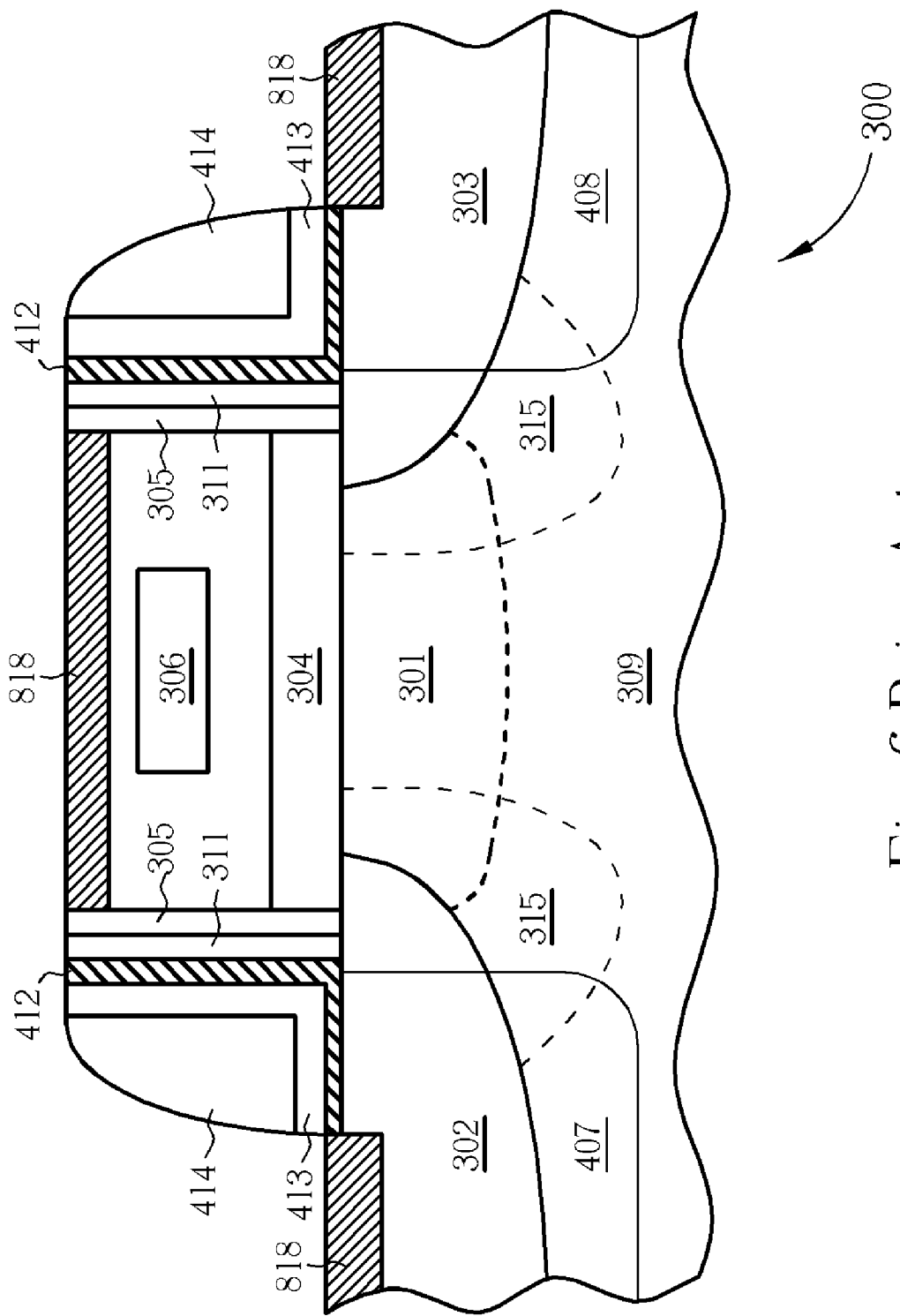

Please refer to FIGS. 7-13. FIGS. 7-13 are schematic cross-sectional diagrams illustrating a method of fabricating MOS transistors in accordance with a first preferred embodiment of the present invention, wherein like number numerals designate similar or the same parts, regions or elements. It is to be understood that the drawings are not drawn to scale and are served only for illustration purposes. It is to be understood that some lithographic and etching processes relating to the present invention method are known in the art and thus not explicitly shown in the drawings.

Figure 7:
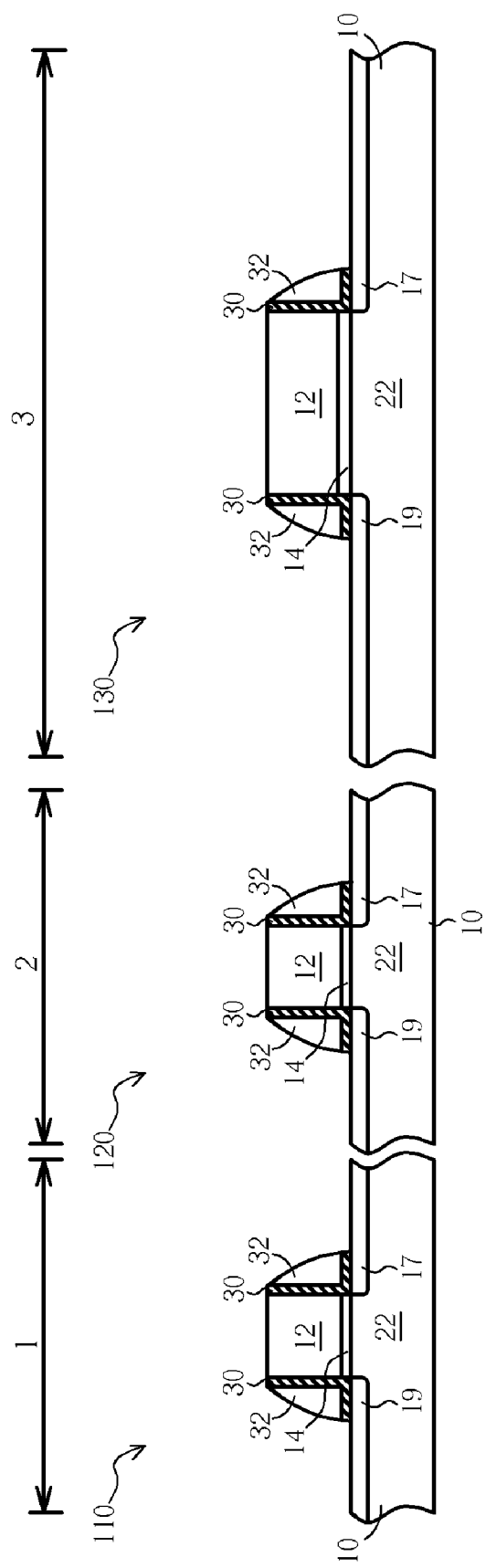
FIGS. 7-13 are schematic cross-sectional diagrams illustrating a method of fabricating MOS transistors in accordance with a first preferred embodiment of the present invention.

The present invention pertains to a method of fabricating a MOS transistor used in integrated circuits, such an N-type MOS (NMOS) transistor, a P-type MOS (PMOS) transistor or a complementary MOS (CMOS) device. For detailed description, processes for MOS transistors in different regions are demonstrated through FIGS. 7-13. As shown in FIG. 7, a semiconductor substrate 10 is prepared. The semiconductor substrate 10 may be a silicon substrate or a silicon-on-insulator (SOI) substrate, but not limited thereto. A first active region 1, a second active region 2 and a third active region 3 are defined in the semiconductor substrate 10. For instance, the first active region 1 can be a core circuit region, the second active region 2 can be an input/output (I/O) region, and the third active region 3 can be an electrostatic discharge (ESD) region. The MOS transistor 110 formed in the first active region 1, the MOS transistor 120 formed in the second active region 2, and the MOS transistor 130 formed in the third active region 3 can be NMOS transistors or PMOS transistors.

A gate dielectric layer 14 and a gate 12 are first formed on the semiconductor substrate 10 in each active region (the first active region 1, the second active region 2, and the third active region 3), respectively. The gate dielectric layer 14 and the gate 12 form a gate structure. The gates 12 generally comprise a conductive material, such as doped polysilicon. The gate dielectric layer 14 may be made of high-k materials, such as silicon dioxide or silicon nitride. A shallow-junction source extension 17 and a shallow-junction drain extension 19 are thereon formed within the semiconductor substrate 10 on the opposite sides of each gate structure 12. Each source extension 17 and the corresponding drain extension 19 are separated by a channel region 22.

Two covering layers (not shown in the figures) are formed by a chemical vapor deposition (CVD) process to cover the gates 12 and the semiconductor substrate 10. An anisotropic etching process is subsequently performed on the covering layers to turn the two covering layers into liners 30 and spacers 32. Each of the liners 30 is positioned on two opposite sidewalls of each gate 12, and each of the spacers is positioned on the corresponding liner 30. The liners 30 are typically L shaped, and may further comprise an offset spacer that is known in the art and is thus omitted in the figures. The liners 30 may include silicon oxide, and the spacers 32 may include a silicon nitride compound or a silicon oxide compound.

Figure 8:
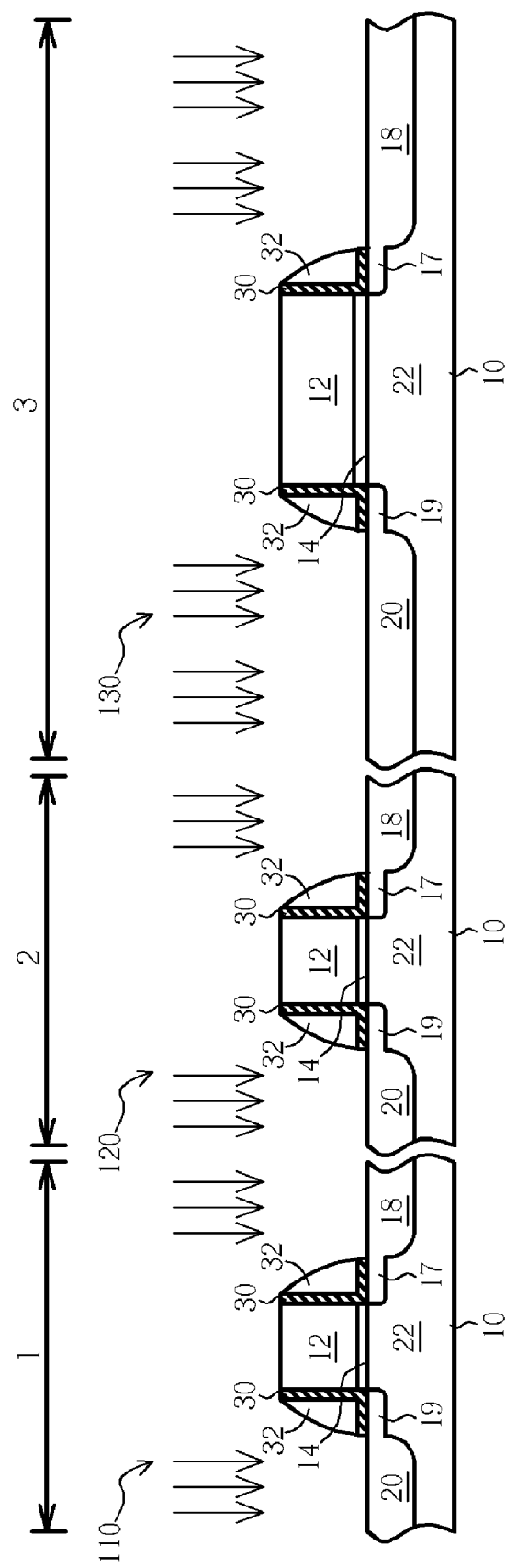

As shown in FIG. 8, after forming the spacers 32, an ion implantation process is carried out to dope dopant species into the semiconductor substrate 10, thereby forming a source region 18 and a drain region 20 in each active region (the first active region 1, the second active region 2, and the third active region 3). For NMOS, the dopant species may be N-type dopant species, such as arsenic, antimony or phosphorous. For PMOS, the dopant species may be P-type dopant species, such as boron or aluminum.

Besides, the semiconductor substrate 10 can optionally undergo an activating process, such as a rapid thermal annealing process or an annealing process. The purpose of the activating process is to activate the dopants implanted in the source extensions 17, the drain extensions 19, the source regions 18 and the drain regions 20, and to cure crystal damage induced by the previous active implant process. Since there are other thermal processes included in the subsequent processes, this activating process is not necessary here. The activating process can be performed in a step after a stressed cap layer is formed to activate the dopants implanted in the source extensions 17, the drain extensions 19, the source regions 18 and the drain regions 20.

Figure 9:
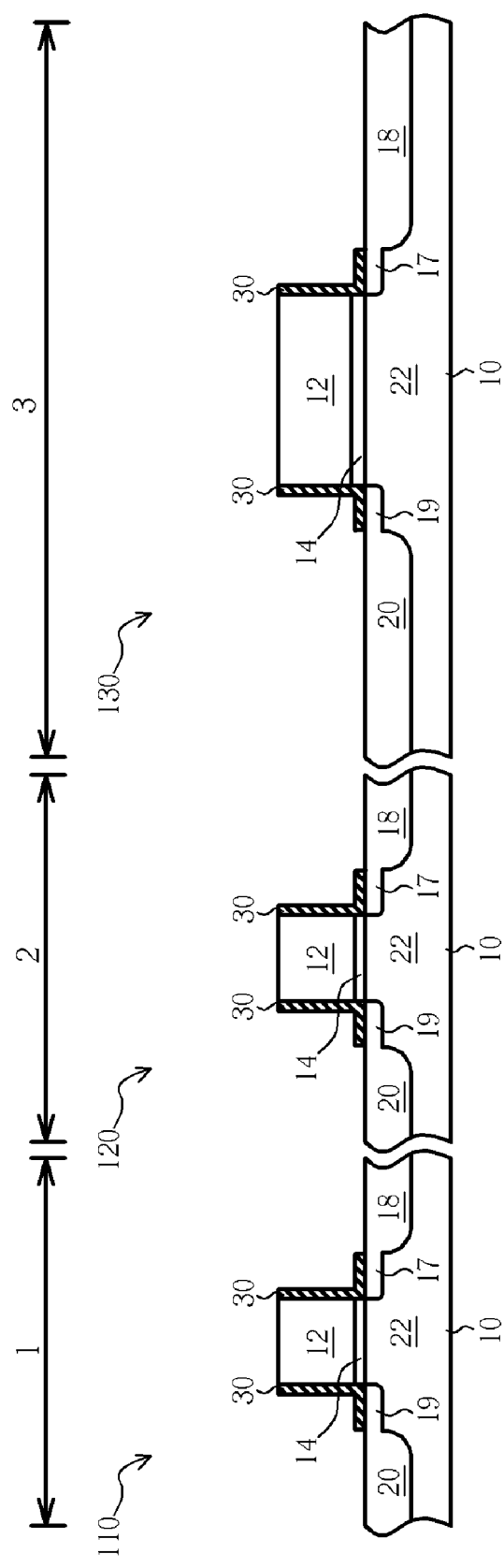

As shown in FIG. 9, the spacers 32 are stripped away, and the liners 30 are maintained on the sidewalls of the gate 12. After removing the silicon nitride spacers, approximately L shaped liners are left. However, this invention is not limited to an L shaped liner. It is to be understood that a mild etching process may be carried out to slightly etch the liners 32, thereby shrinking its thickness. In another case, the liner may even be etched away.

Figure 10:
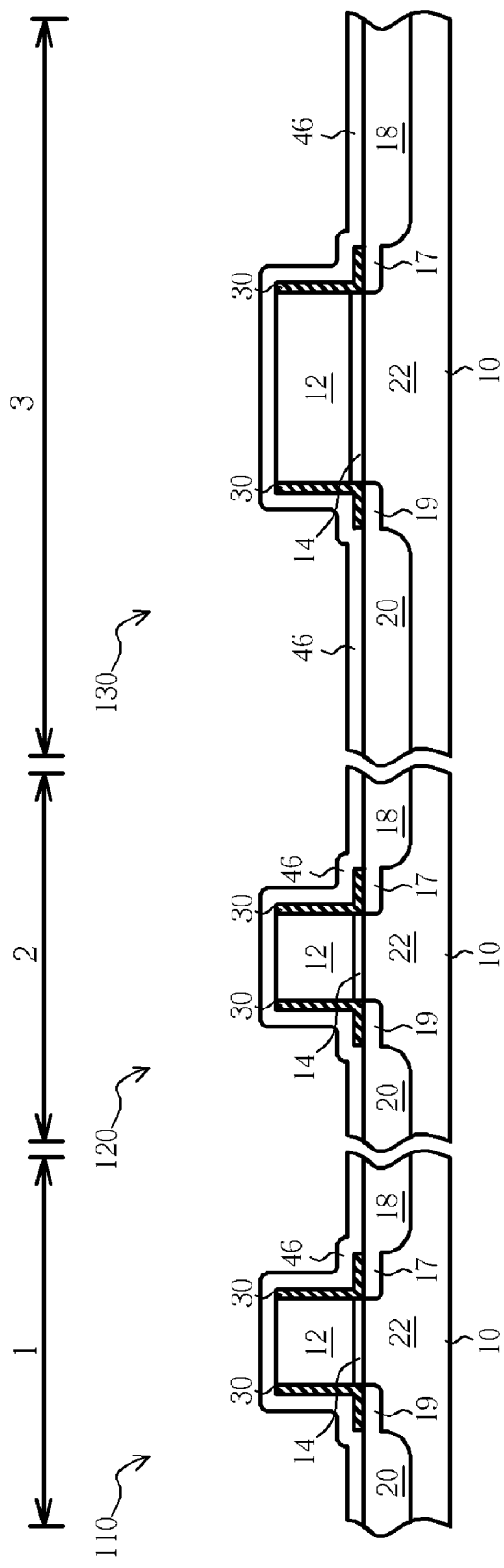

As shown in FIG. 10, subsequently, a stressed cap layer 46 is formed to cover the surfaces of the semiconductor substrate 10, the gates 12, the liners 30, the source regions 18 and the drain regions 20. In accordance with one aspect of the present invention, the stressed cap layer 46 can be a single-layer structure that includes silicon oxide or silicon nitride. Preferably, the stressed cap layer 46 has a thickness of about 10-3000 angstroms. Taking the stressed cap layer 46 having a silicon oxide layer as an example, a high temperature oxidation process can be carried out to generally form a high temperature oxide as the stressed cap layer 46 on the semiconductor substrate 10. Otherwise, a sub-atmospheric pressure chemical vapor deposition (SACVD) process can be carried out to form the stressed cap layer 46 on the semiconductor substrate 10.

It is to be understood by those skilled in the art that the stressed cap layer 46 can optionally undergo some semiconductor processes to change a stress of the stressed cap layer 46, to release a tensile-stress of the stressed cap layer 46, or to enhance a compressive-stress of the stressed cap layer 46. For instance, the alteration of the stress of the stressed cap layer 46 is accomplished by using a germanium ion implantation. Otherwise, a lithographic and etching process can be performed on the stressed cap layer 46 to remove the stressed cap layer 46 from PMOS transistors. The technology of combining tensile-stressed cap layer and compressive-stressed cap layer is called selective strain scheme (SSS).

Figure 11:
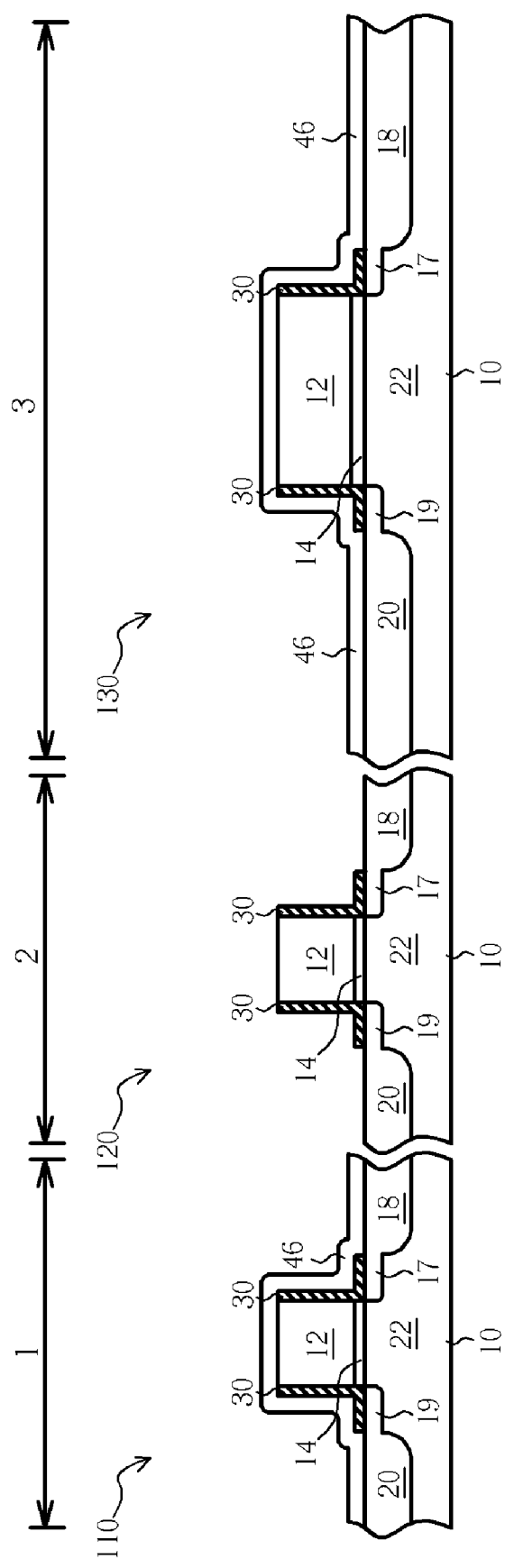

As shown in FIG. 11, according to this preferred embodiment, because the stress of the MOS transistor 120 in the second active region 2 has no need to be changed, the stressed cap layer 46 in the second active region 2 can be removed by a lithographic and etching process. As a result, the gate 12, the source region 18 and the drain region 20 in the second active region 2 are exposed, and the stressed cap layer 46 in the first active region 1 and the third active region 3 is maintained.

Next, an in-situ or a non in-situ activating process, such as a UV curing process, an annealing process, a thermal spike annealing process, or an e-beam treatment, is performed on the stressed cap layer 46 to make the MOS transistor 110 and the MOS transistor 130 memorize the stress and at the same time expand the semiconductor substrate 10 underneath the gate dielectric layer 14, such as the lattice arrangement in the channel region. Thus, the electron mobility in the channel regions within the first active region 1 and the third active region 3 are increased, and the driving currents of the MOS transistor 110 and the MOS transistor 130 are therefore raised.

In terms of the experiment data, for the stressed cap layer 46 having a single-layer structure, the stressed cap layer 46 made by SACVD process can increase an ion gain percentage of a NMOS transistor by about 5.3%, and only decrease an ion gain percentage of a PMOS transistor by about 0.7%. The stressed cap layer 46 made by a high temperature oxidation process can increase an ion gain percentage of a NMOS transistor by about 4.4%, and can even increase an ion gain percentage of a PMOS transistor by about 0.4%.

According to the present invention, the stressed cap layer 46 is initially deposited in a first stress status such as a tensile-stressed status. Since the spacers 32 have been removed, the stressed cap layer 46 directly borders the liners 30 on the sidewalls of the gates 12. Without obstructions formed by the spacers 32, the stressed cap layer 46 can act on the MOS transistor 110 and the MOS transistor 130 more directly. Thus, the channel regions of the MOS transistor 110 and the MOS transistor 130 suffer tensile-stress, which is provided by the stressed cap layer 46 adjacent to the liners 30 directly, along a direction parallel to the channel regions so as to increase a drive current of the MOS transistor 110 and the MOS transistor 130, and develop the performance of the MOS transistor 110 and the MOS transistor 130.

Figure 12:
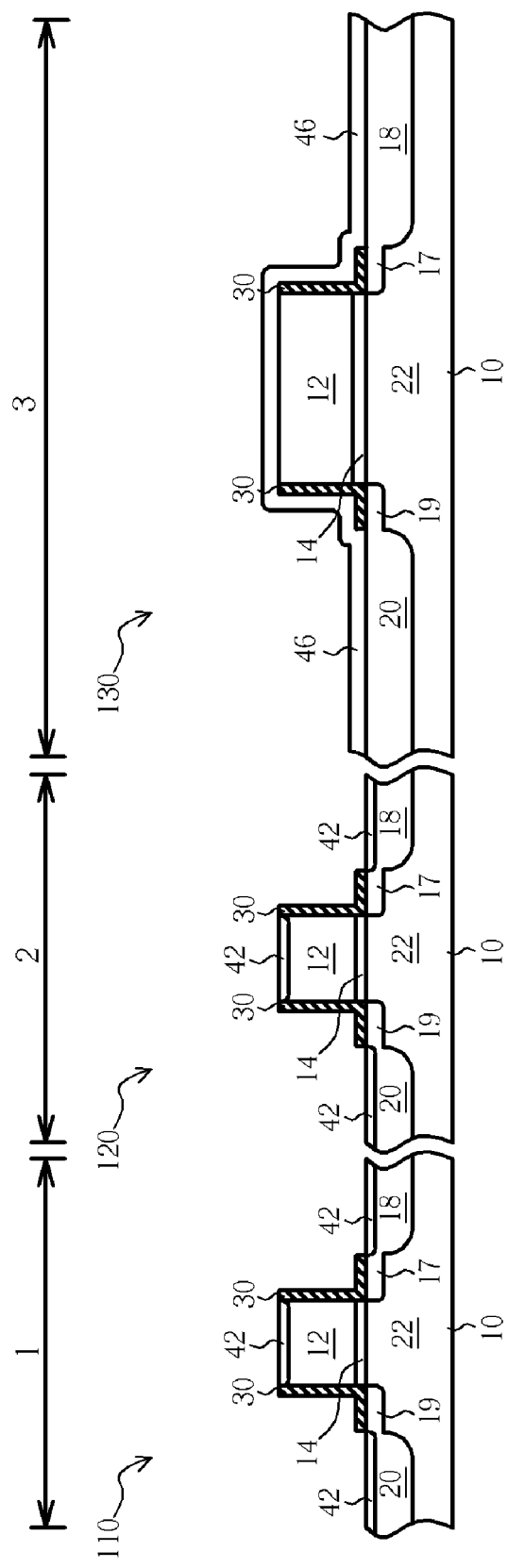

As shown in FIG. 12, in order to form salicide in the first active region 1 and in the second active region 2, a lithographic and etching process can be performed to remove the stressed cap layer 46 in the first active region 1. The stressed cap layer 46 therefore exposes the predetermined regions, such as the gates 12, the source regions 18 and the drain regions 20 in the first active region 1 and the second active region 2, to form the follow-up salicide. The remaining stressed cap layer 46 acts as a salicide block in the follow-up process.

Afterward, a salicide process is performed. A metal layer (not shown in the figures), such as a nickel layer, is sputtered on a surface of the semiconductor substrate 10. The metal layer covers the gates 12, the source regions 18, the drain regions 20 and the semiconductor substrate 10 in the first active region 1, the second active region 2 and the third active region 3. Next, a rapid thermal annealing process can be performed to make a salicide layer 42 by reacting the metal layer with the gates 12, the source regions 18 and the drain regions 20 in the first active region 1 and the second active region 2. Furthermore, a selective wet etching process is performed to remove the unreacted metal layer by utilizing mixtures containing $NH_4OH/H_2O_2/H_2O$ (ammonia hydrogen peroxide mixture, APM) or $H_2SO_4/H_2O_2$ (sulfuric acid-hydrogen peroxide mixture, SPM).

Figure 13:
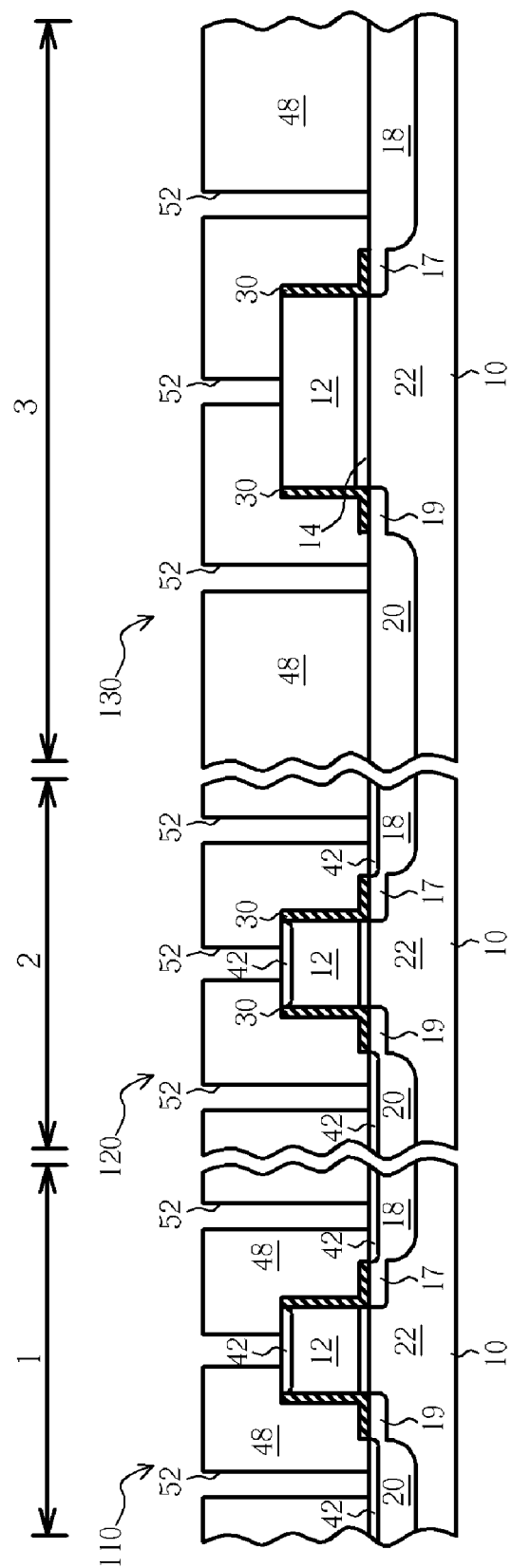

As shown in FIG. 13, an etching presses is carried out to remove the stressed cap layer 46. Subsequently, a dielectric layer 48 is deposited over the semiconductor substrate 10. The dielectric layer 48 may be made of silicon oxide, doped silicon oxide or other suitable materials such as low-k materials. A lithographic and etching processes are thereon carried out to form contact holes 52 in the dielectric layer 48. The contact holes 52 communicate with the gates 12, the source regions 18 and the drain regions 20 of the MOS transistor 110, the MOS transistor 120 and the MOS transistor 130. Additionally, those skilled in this art should know that the present invention could be combined with contact etch stop layers (CESLs, not shown in the figure). In other words, after the above-mentioned processes are performed, a contact etch stop layer can be formed on the MOS transistor 110, the MOS transistor 120 and the MOS transistor 130, and the contact etch stop layer can have different stress statuses. For example, the contact etch stop layer on a PMOS is compressively stressed; while the contact etch stop layer on a NMOS is tensile-stressed.

Figure 14:
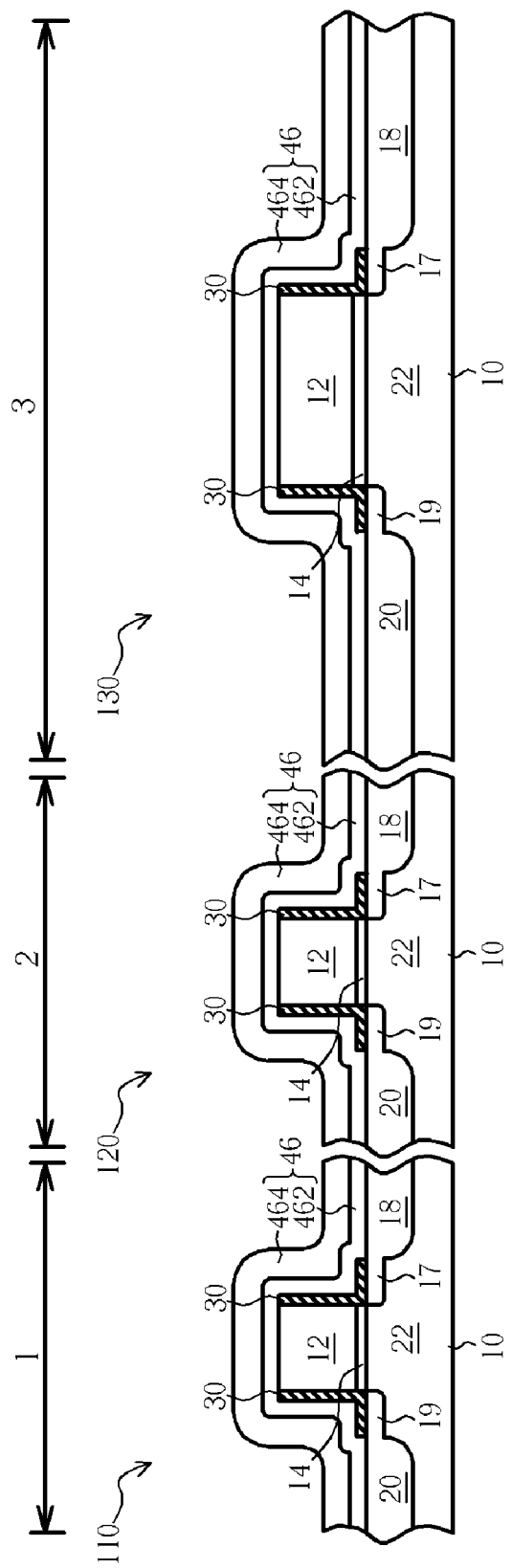
FIG. 14 is a schematic cross-sectional diagram illustrating MOS transistors having a stressed cap layer in accordance with a second preferred embodiment of the present invention.

According to another embodiment of this invention, the stressed cap layer 46 can be a double-layer structure. Please refer to FIG. 14. FIG. 14 is a schematic cross-sectional diagram illustrating MOS transistors having a stressed cap layer in accordance with a second preferred embodiment of the present invention, wherein like number numerals designate similar or the same parts, regions or elements. In this preferred embodiment, the stressed cap layer 46 comprises a silicon oxide layer 462 and a silicon nitride layer 464 positioned on the silicon oxide layer 462. The silicon oxide layer 462 can be formed by a high temperature oxidation process or a SACVD process, and has a thickness of about 50-2000 angstroms. The silicon nitride layer 464 can be formed by a chemical vapor deposition process. Preferably, a thickness of the silicon nitride layer 464 is between 100-200 angstroms. It should be noticed that the thicknesses mentioned in the present invention are set for a 65 nm process. It is to be understood that all sizes in the present invention can be changed as required. In other words, as the size of the MOS transistors becomes smaller, the thickness of the stressed cap layer 46 will also become thinner to provide a proper stress.

For the stressed cap layer 46 having a double-layer structure, the stressed cap layer 46 including a silicon nitride layer 464 having a thickness of about 300 angstroms and a silicon oxide layer 462, which is made by a SACVD process, can increase an ion gain percentage of a NMOS transistor by about 11.4%, and decrease an ion gain percentage of a PMOS transistor by about 25.5%. The stressed cap layer 46 including a silicon nitride layer 464 having a thickness of about 190 angstroms and a silicon oxide layer 462, which is made by a SACVD process, can increase an ion gain percentage of a NMOS transistor by about 10.8%, and only decreases an ion gain percentage of a PMOS transistor by about 9.8%.

The present invention can greatly increase an ion gain percentage of a NMOS transistor, and make a PMOS transistor suffer smaller amount of ion gain loss. Even more, an ion gain percentage of a PMOS transistor can be increased. In order to increase an ion gain percentage of a NMOS transistor, and cause no damage in a PMOS transistor, some semiconductor processes can be further carried out to cooperate with the above-mentioned process. For instance, a stressed cap layer 46 including a silicon nitride layer 464 having a thickness of about 190 angstroms and a silicon oxide layer 462 can first be formed on a MOS transistor. Subsequently, a lithographic and etching process is performed to remove the stressed cap layer 46 on a PMOS transistor. Next, an activating process is performed to activate the semiconductor substrate 10, and to make the MOS transistor memorize the stress. Otherwise, a stressed cap layer 46 including a silicon nitride layer 464 having a thickness of about 190 angstroms and a silicon oxide layer 462 can first be formed on a MOS transistor. Subsequently, a germanium ion implantation is performed to release a tensile-stress of the stressed cap layer 46 on a PMOS transistor. Next, an activating process is performed to make the NMOS transistor and the PMOS transistor memorize the stress.

Figure 15:
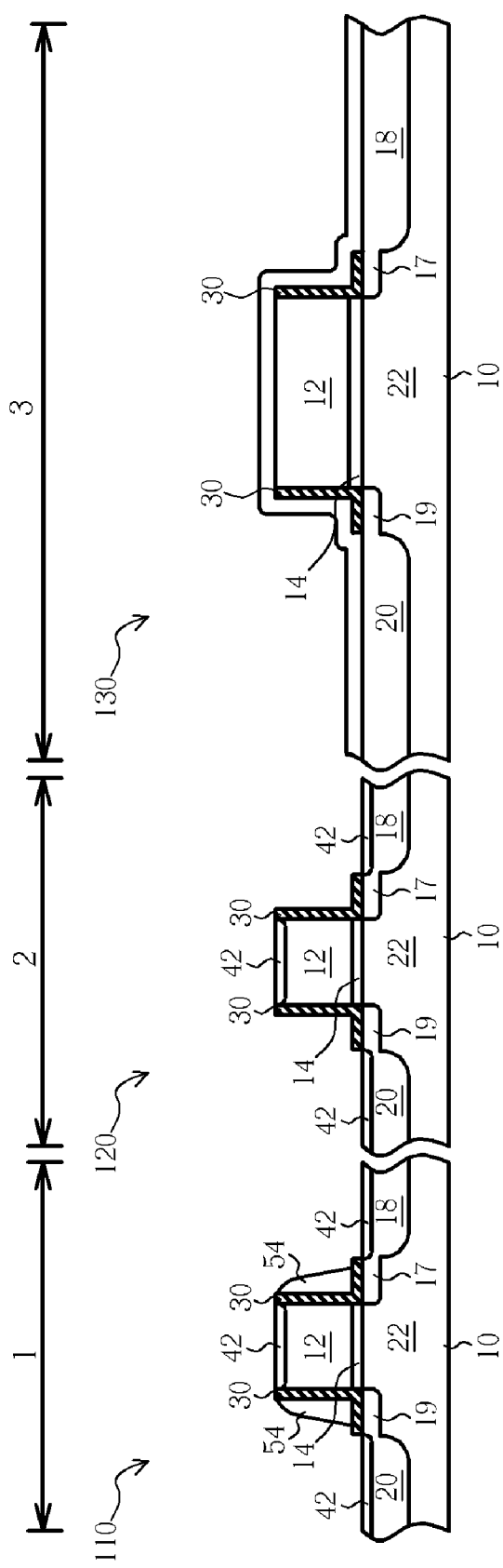
FIGS. 15-16 are schematic cross-sectional diagrams illustrating a method of fabricating MOS transistors in accordance with the third preferred embodiment of the present invention.
Figure 16:
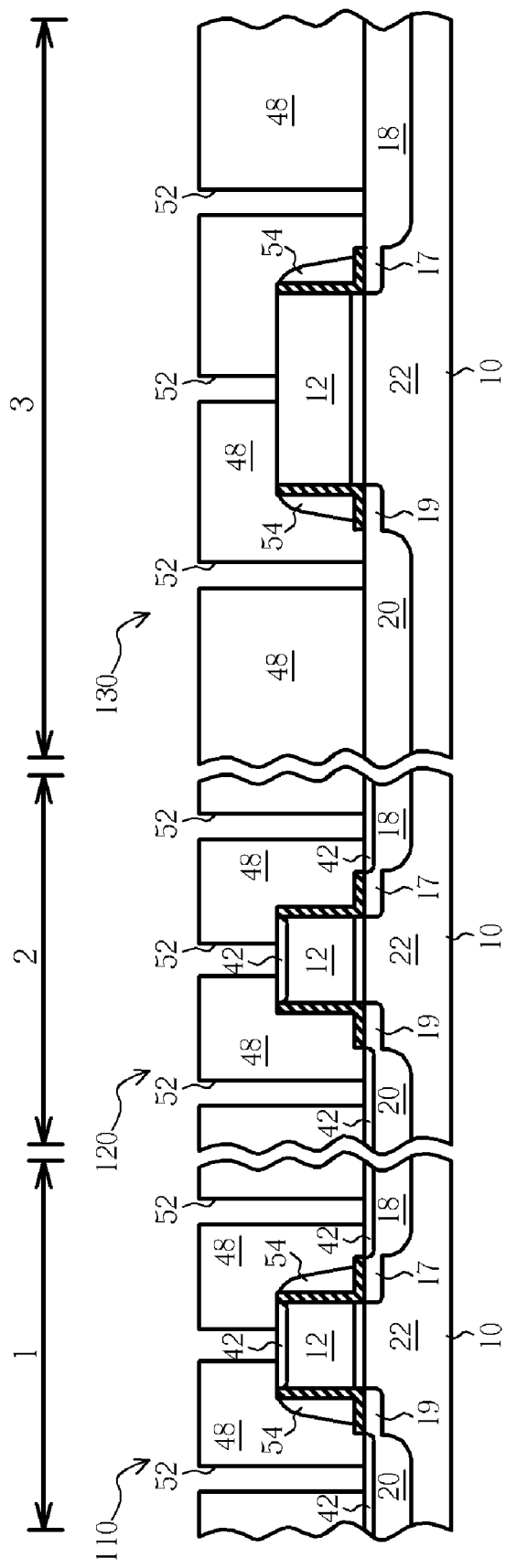

According to a third preferred embodiment of the present invention, parts of the stressed cap layer 46 can remain around the MOS transistors. Please refer to FIGS. 15-16. FIGS. 15-16 are schematic cross-sectional diagrams illustrating a method of fabricating MOS transistors in accordance with the third preferred embodiment of the present invention. In this preferred embodiment, the MOS transistor 110, the MOS transistor 120, the MOS transistor 130 and the stressed cap layer 46 are first formed on the semiconductor substrate 10 by the steps shown in FIGS. 7-11. Subsequently, as shown in FIG. 15, a lithographic and etching process can be carried out to remove the stressed cap layer 46 on the semiconductor substrate 10, the gate 12, the source region 18 and the drain region 20 in the first active region 1, and the stressed cap layer 46 on the liner 30 remains for serving as a stressed spacer 54. As a result, the stressed cap layer 46 can expose the regions that are predetermined to form the follow-up salicide. Meanwhile, the stressed spacer 54 can provide a protection for the MOS transistor 110.

Afterward, a salicide process is performed. A metal layer (not shown in the figure) is sputtered on a surface of the semiconductor substrate 10. The metal layer covers the gates 12, the source regions 18, the drain regions 20 and the semiconductor substrate 10 in the first active region 1, the second active region 2 and the third active region 3. Next, a rapid thermal annealing process can be performed to make a salicide layer 42 by reacting the metal layer with the gates 12, the source regions 18 and the drain regions 20 in the first active region 1 and the second active region 2. Furthermore, a selective wet etching process is performed to remove the unreacted metal layer by utilizing APM or SPM.

As shown in FIG. 16, an etching presses is carried out to remove the stressed cap layer 46 on the semiconductor substrate 10, the gate 12, the source region 18 and the drain region 20 within the third active region 3, and the stressed cap layer 46 on the liners 30 of the MOS transistor 110 and the MOS transistor 130 remain for serving as two stressed spacers 54. Subsequently, a dielectric layer 48 is deposited over the semiconductor substrate 10. The said dielectric layer 48 may be made of silicon oxide, doped silicon oxide or other suitable materials such as low-k materials. A lithographic and etching processes are thereon carried out to form contact holes 52 in the dielectric layer 48. The contact holes 52 communicate with the gates 12, the source regions 18 and the drain regions 20 of the MOS transistor 110, the MOS transistor 120 and the MOS transistor 130.

Figure 17:
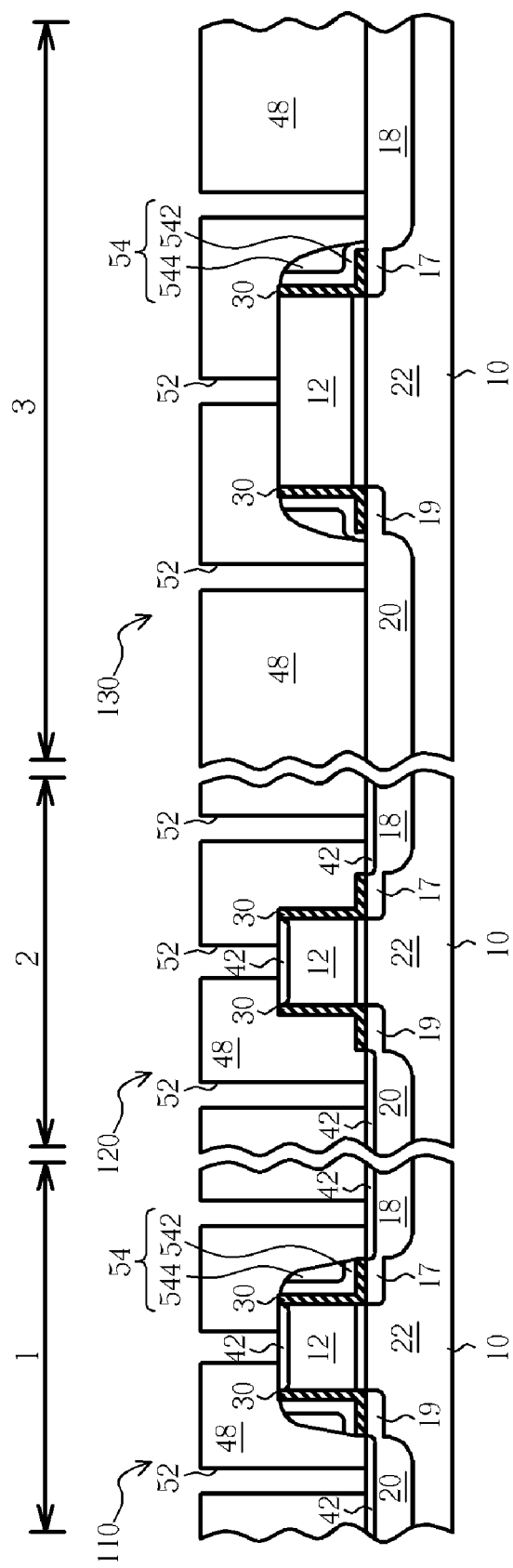
FIG. 17 is a schematic cross-sectional diagram illustrating MOS transistors having stressed spacers in accordance with a fourth preferred embodiment of the present invention.

According to another embodiment of the present invention, the stressed cap layer 46 can be a double-layer structure. Please refer to FIG. 17. FIG. 17 is a schematic cross-sectional diagram illustrating MOS transistors having stressed spacers in accordance with a fourth preferred embodiment of the present invention, wherein like number numerals designate similar or the same parts, regions or elements. In this preferred embodiment, each of the stressed spacers 54 comprises a silicon oxide layer 542 and a silicon nitride layer 544 positioned on the silicon oxide layer 542. The silicon oxide layer 542 can be formed by a high temperature oxidation process or a SACVD process, and has a thickness of about 50-2000 angstroms. The silicon nitride layer 544 can be formed by a chemical vapor deposition process. Preferably, a thickness of the silicon nitride layer 544 is between 100-200 angstroms.

It should be noticed that an edge of the stressed spacer 54 can be set corresponding to an edge of the liner 30 (as shown in the first active region 1 of FIG. 17). An edge of the stressed spacer 54 can cover an edge of the liner 30 (as shown in the third active region 3 of FIG. 17). Additionally, an edge of the stressed spacer 54 can expose an edge of the liner 30 (as shown in the first active region 1 of FIG. 16).

From one aspect of the present invention, the stressed cap layer is formed on a MOS transistor after the spacer on the MOS transistor is removed. Since the spacer has been removed, the stressed cap layer can directly border the liner on the sidewalls of the gate. Without obstructions formed by the spacer, the stressed cap layer can act on the MOS transistor more directly, and change a lattice constant of the channel region. Thus, the channel region of the MOS transistor suffers stress, which is provided by the stressed cap layer, along a direction parallel to the channel region. Therefore, the present invention can increase a drive current of the MOS transistor, and develop the performance of the MOS transistor. In addition, the stressed cap layer can act as a salicide block in the salicide process so that the processes of forming the MOS transistor are simplified.

According to the above-mentioned processes, the present invention can form MOS transistors having different structures in accordance with different regions simultaneously. For example, a MOS transistor having a strained silicon channel and a salicide, a MOS transistor having a strained silicon channel and having no salicide, a MOS transistor having no strained silicon channel and no salicide can be formed in the meantime. As a result, the present invention not only can fabricate many MOS transistors in the meantime, but also can fabricate many different kinds of MOS transistors according to the design of products.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming MOS transistors, comprising:
providing a semiconductor substrate, a first active region, a second active region and a third active region being defined in the semiconductor substrate, each of the active regions comprising at least a gate structure, two sidewalls on each of the gate structures comprising a liner, each of the active regions comprising a source region and a drain region in the semiconductor substrate on the opposite sides of the gate structure;
forming a stressed cap layer on the semiconductor substrate, covering the gate structures, the liners, the source regions and the drain regions in the first, the second and the third active regions;
performing a first etching process on the stressed cap layer to expose the gate structure, the source region and the drain region in the second active region;
performing an activating process on the source regions, the drain regions and the stressed cap layer;
performing a second etching process on the stressed cap layer to expose the gate structure, the source region and the drain region in the first active region; and
performing a salicide process to form a silicide layer on the gate structures, the source regions and the drain regions that are not covered by the stressed cap layer in the first and the second active regions.

2. The method of forming MOS transistors according to claim 1, wherein the first active region is a core circuit region, the second active region is an input/output region, and the third active region is an electrostatic discharge region.

3. The method of forming MOS transistors according to claim 1, wherein the stressed cap layer comprises a silicon oxide layer or a silicon nitride layer.

4. The method of forming MOS transistors according to claim 3, wherein a thickness of the stressed cap layer is in a range of 100 to 200 angstroms.

5. The method of forming MOS transistors according to claim 1, wherein the stressed cap layer comprises a silicon oxide layer and a silicon nitride layer positioned on the silicon oxide layer.

6. The method of forming MOS transistors according to claim 5, wherein a thickness of the silicon nitride layer is in a range of 100 to 200 angstroms.

7. The method of forming MOS transistors according to claim 1, wherein the activating process comprises the steps of:
performing a first annealing process on the source regions and the drain regions to activate the source regions and the drain regions; and
performing a second annealing process on the stressed cap layer.

8. The method of forming MOS transistors according to claim 1, wherein the stressed cap layer acts as a salicide block in the salicide process.

9. The method of forming MOS transistors according to claim 1, wherein the stressed cap layer in the second active region is completely removed in the first etching process.

10. The method of forming MOS transistors according to claim 1, wherein the stressed cap layer in the first active region is completely removed in the second etching process.

11. The method of forming MOS transistors according to claim 1, wherein the stressed cap layer on the semiconductor substrate, the gate structure, the source region and the drain region in the first active region is removed in the second etching process, and the stressed cap layer on the liner remains for serving as a spacer.

12. The method of forming MOS transistors according to claim 1, wherein at least one of the MOS transistors is an NMOS transistor.

13. The method of forming MOS transistors according to claim 1, wherein at least one of the MOS transistors is a PMOS transistor.

14. The method of forming MOS transistors according to claim 13 further comprising a step of performing an ion implanting process on the stressed cap layer after forming the stressed cap layer, so to release a tensile-stress of the stressed cap layer on the PMOS transistor.

* * * * *